United States Patent
Sinha et al.

(10) Patent No.: US 7,786,016 B2
(45) Date of Patent: Aug. 31, 2010

(54) METHODS OF UNIFORMLY REMOVING SILICON OXIDE AND A METHOD OF REMOVING A SACRIFICIAL OXIDE

(75) Inventors: Nishant Sinha, Boise, ID (US); Gurtej S. Sandhu, Boise, ID (US); Joseph N. Greeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 417 days.

(21) Appl. No.: 11/652,218

(22) Filed: Jan. 11, 2007

(65) Prior Publication Data

US 2008/0171438 A1 Jul. 17, 2008

(51) Int. Cl.
*H01L 21/302* (2006.01)
*H01L 21/461* (2006.01)

(52) U.S. Cl. .................. 438/705; 438/911; 257/E21.54; 257/E21.545; 257/E21.312

(58) Field of Classification Search ................. 438/705, 438/911; 257/E21.54, E21.545, E21.312, 257/E21.252, E21.31, E21.311
See application file for complete search history.

(56) References Cited

U.S. PATENT DOCUMENTS

| | | | |
|---|---|---|---|
| 5,766,971 A * | 6/1998 | Ahlgren et al. ............. 438/296 |
| 6,271,136 B1 | 8/2001 | Shue et al. |
| 6,291,307 B1 * | 9/2001 | Chu et al. .................. 438/393 |
| 6,335,261 B1 * | 1/2002 | Natzle et al. ............... 438/435 |
| 6,656,824 B1 | 12/2003 | Hanafi et al. |
| 6,838,347 B1 | 1/2005 | Liu et al. |
| 6,926,843 B2 * | 8/2005 | Cantell et al. ............. 216/51 |
| 6,951,821 B2 | 10/2005 | Hamelin et al. |
| 6,986,914 B2 | 1/2006 | Elers et al. |
| 7,091,069 B2 | 8/2006 | Doris et al. |
| 7,181,306 B2 | 2/2007 | Decrosta |
| 2001/0053585 A1 | 12/2001 | Kikuchi et al. |
| 2004/0185583 A1 | 9/2004 | Tomoyasu et al. |
| 2005/0124134 A1 * | 6/2005 | Hao et al. .................. 438/424 |
| 2006/0051966 A1 | 3/2006 | Or et al. |
| 2006/0196527 A1 | 9/2006 | Nishimura et al. |
| 2007/0066005 A1 * | 3/2007 | Hieda et al. ............... 438/207 |
| 2008/0318392 A1 * | 12/2008 | Hung et al. ............... 438/435 |

OTHER PUBLICATIONS

Michael Quirk, et al Semiconductor Manufacturing Technology:, Prentice Hall, (2001), pp. 207-210.*
Kiehlbauch et al., U.S. Appl. No. 12/114,380, filed May 2, 2008.
Greeley et al., U.S. Appl. No. 11/777,005, filed Jul. 12, 2007.

(Continued)

*Primary Examiner*—Caridad M Everhart
(74) *Attorney, Agent, or Firm*—Traskbritt

(57) ABSTRACT

A method of substantially uniformly removing silicon oxide is disclosed. The silicon oxide to be removed includes at least one cavity therein or more than one density or strain therein. The silicon oxide having at least one cavity or more than one density or strain is exposed to a gaseous mixture of $NH_3$ and HF and heated, to substantially uniformly remove the silicon oxide. A method of removing an exposed sacrificial layer without substantially removing exposed isolation regions using the gaseous mixture of $NH_3$ and HF and heat is also disclosed, as is an intermediate semiconductor device structure that includes a semiconductor substrate, a sacrificial layer overlying the semiconductor substrate, a diffusion barrier overlying the sacrificial layer, and exposed isolation regions.

27 Claims, 5 Drawing Sheets

OTHER PUBLICATIONS

Haring et al., Reactivity of a Fluorine Passivated Silicon Surface, J. Vac. Sci. Technol., vol. 10, No. 4, Jul./Aug. 1992, pp. 802-805.

Greer et al, Fundamental Beam Studies of Deuterium and Fluorine Radical Reaction Kinetics on Surfaces, J. Vac. Sci. Technol., vol. 21, No. 4, Jul./Aug. 2003, pp. 1391-1402.

Vetter et al., Improvement Crystalline Silicon Surface Passivation by Hydrogen Plasma Treatment, Applied Physics Letters, vol. 84, No. 9, Mar. 1, 2004, pp. 1474-1476.

* cited by examiner

METHODS OF UNIFORMLY REMOVING SILICON OXIDE AND A METHOD OF REMOVING A SACRIFICIAL OXIDE

FIELD OF THE INVENTION

Embodiments of the invention relate to fabricating an intermediate semiconductor device structure. Specifically, embodiments of the invention relate to uniformly removing silicon oxide from intermediate semiconductor device structures, to removing a sacrificial oxide without substantially removing an isolation oxide, and an intermediate semiconductor device structure including same.

BACKGROUND OF THE INVENTION

Chemical Oxide Removal ("COR") is a gaseous process known in the art to selectively etch oxides. In COR, gaseous ammonia ("$NH_3$") and hydrogen fluoride ("HF") are reacted to produce $NH4F_x$, which reacts with silicon oxide on a semiconductor wafer to form ammonium hexafluorosilicate ("$(NH_4)_2SiF_6$"). The semiconductor wafer is then heated, producing nitrogen ("$N_2$"), water ("$H_2O$"), silicon tetrafluoride ("$SiF_4$"), and $NH_3$, which are volatile and evaporate from the surface of the semiconductor wafer. Alternatively, the $(NH_4)_2SiF_6$ is removed using a deionized ("DI") water rinse. COR is marketed under the tradename CERTASE® by Tokyo Electron Limited. Additional $NH_3$/HF-based chemistries for etching oxides are marketed by ULVAC Technologies, Inc. (Methuen, Mass.) and Applied Materials, Inc. (Santa Clara, Calif.). U.S. Pat. No. 6,951,821 discloses a method of trimming an oxide hard mask using a chemical treatment and a thermal treatment. The chemical treatment includes exposing the oxide hard mask to $NH_3$ and HF. The thermal treatment includes heating the oxide hard mask to a temperature that ranges from 20° C.-200° C. The combination of the chemical treatment and the thermal treatment etches a thermal oxide at greater than 10 nm per 60 seconds of chemical treatment and tetraethyl orthosilicate ("TEOS") at greater than 10 nm per 180 seconds of chemical treatment.

COR has also been used to selectively remove small amounts (1 nm-30 nm) of silicon oxides, such as a native oxide or a thermal oxide, relative to polysilicon. United States Patent Application Publication No. 2006/0196527 discloses using COR to remove $SiO_2$ in a pre-metal-silicon contact formation cleaning, to remove $SiO_2$ before a silicon epitaxial process, or to remove $SiO_2$ from a polysilicon wafer before depositing a silicide metal.

U.S. Pat. No. 7,091,069 discloses using a plasma or vapor of HF and $NH_3$ to remove a sacrificial oxide layer on a silicon-on-insulator ("SOI") metal oxide semiconductor field effect transistor ("MOSFET"). U.S. Pat. No. 6,656,824 discloses using a plasma or vapor of HF and $NH_3$ to remove a sacrificial oxide layer in a MOSFET. The plasma or vapor of HF and $NH_3$ produces undercuts beneath silicon spacers formed on sidewalls of a dielectric layer of the MOSFET. U.S. Pat. No. 6,838,347 discloses etching concave portions of an oxide hardmask at a reduced rate relative to convex portions using a plasma or vapor of HF and $NH_3$.

Shallow trench isolation ("STI") has been commonly used in semiconductor fabrication to provide field isolation. As semiconductor devices are scaled ever smaller, and trenches become narrower, filling the trenches with a dielectric material becomes increasingly difficult. As trench sizes become smaller, seams, voids, gaps, or microbubbles are unavoidably formed in the trenches as the dielectric material is deposited. These seams, voids, gaps, or microbubbles affect the ability to uniformly etch the dielectric material. In addition, if the semiconductor device includes trenches having different widths, uniformly removing the dielectric material from the trenches is difficult. Furthermore, if the semiconductor device includes other exposed layers, removing the dielectric material without removing the other exposed layers is difficult.

BRIEF DESCRIPTION OF THE SEVERAL VIEWS OF THE DRAWINGS

While the specification concludes with claims particularly pointing out and distinctly claiming that which is regarded as the present invention, the advantages of this invention may be more readily ascertained from the following description of the invention when read in conjunction with the accompanying drawings in which:

DETAILED DESCRIPTION OF THE INVENTION

Figure 1A:
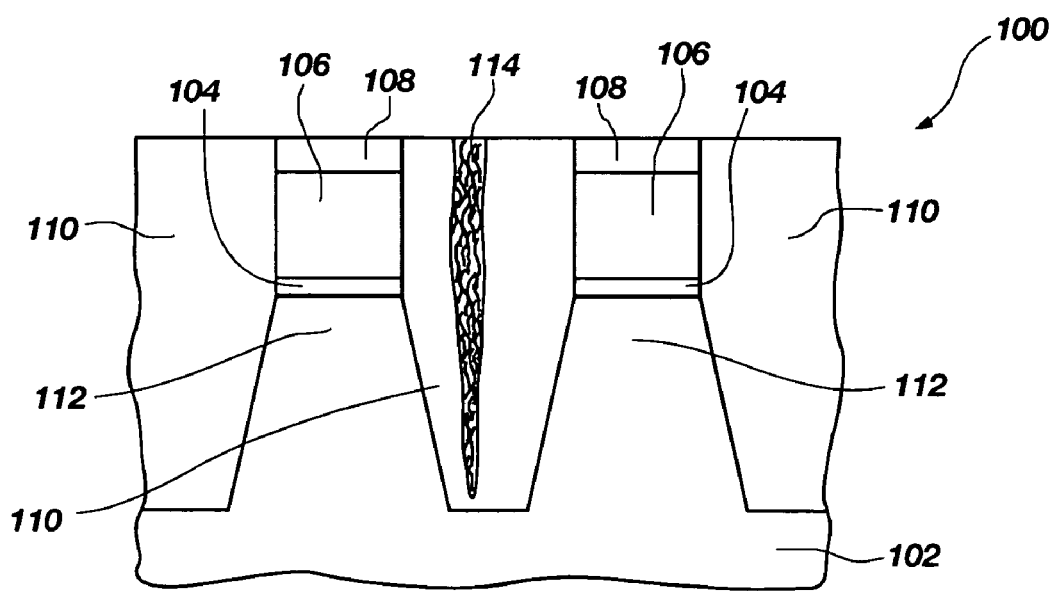
FIGS. 1A-1F are cross-sectional views of an embodiment of an intermediate semiconductor device structure during various stages of fabrication.

An embodiment of a method of substantially uniformly removing silicon oxide is disclosed. The silicon oxide to be removed includes at least one cavity therein. The presence of the at least one cavity affects substantially uniform removal of the silicon oxide. As used herein, the term "silicon oxide" refers to silicon dioxide or other silicon oxide based material. The silicon oxide having the cavity therein may be exposed to a gaseous mixture of $NH_3$ and HF, forming a solid reaction product on a surface of the silicon oxide. Heat may be applied to the silicon oxide and the solid reaction product, producing volatile reaction products. As such, at least a portion of the silicon oxide is substantially uniformly removed.

An embodiment of a second method of uniformly removing silicon oxide is disclosed. The silicon oxide includes at least two portions, wherein a first portion of the silicon oxide has a first property and a second portion of the silicon oxide has a second property. The presence of the at least two portions of the silicon oxide affects substantially uniform removal of the silicon oxide. The silicon oxide may be exposed to the gaseous mixture of $NH_3$ and HF, forming a solid reaction product on a surface of the silicon oxide. Heat may be applied to the silicon oxide and the solid reaction product such that the at least two portions of the silicon oxide are substantially uniformly removed.

An embodiment of a method of removing an exposed sacrificial layer without substantially removing exposed isolation regions using the gaseous mixture of $NH_3$ and HF and heat is also disclosed.

An embodiment of an intermediate semiconductor device structure that comprises a semiconductor substrate, a sacrificial layer overlying the semiconductor substrate, a diffusion barrier overlying the sacrificial layer, and exposed isolation regions is also disclosed. The sacrificial layer is in contact with the exposed isolation regions.

The following description provides specific details, such as material types, material thicknesses, and processing conditions in order to provide a thorough description of embodiments of the present invention. However, a person of ordinary skill in the art would understand that the embodiments of the present invention may be practiced without employing these specific details. Indeed, the embodiments of the present invention may be practiced in conjunction with conventional fabrication techniques employed in the industry. In addition, the description provided below does not form a complete process flow for manufacturing a semiconductor device. The intermediate semiconductor device structures described below do not form a complete semiconductor device. Only those process acts and structures necessary to understand the embodiments of the present invention are described in detail below. Additional acts to form the complete semiconductor device from the intermediate semiconductor device structures may be performed by conventional fabrication techniques.

For the sake of example only, the methods are described below in reference to fabricating an STI region on a device, such as a NAND FLASH device, a dynamic random access memory ("DRAM") device, a logic device, or other device. However, the methods may also be used in other situations where silicon oxide is to be uniformly removed. The memory device may be used in wireless devices, personal computers, or other electronic devices, without limitation.

FIGS. 1A-1F illustrate the fabrication of a portion of a memory array that includes the STI region. FIG. 1A illustrates an intermediate semiconductor device structure 100 after several processing acts have already been conducted. The intermediate semiconductor device structure 100 may include a semiconductor substrate 102 having a first dielectric layer 104 thereon. As used herein, the term "semiconductor substrate" refers to a conventional silicon substrate or other bulk substrate having a layer of semiconductor material. As used herein, the term "bulk substrate" includes not only silicon wafers, but also silicon-on-insulator ("SOI") substrates, silicon-on-sapphire ("SOS") substrates, epitaxial layers of silicon on a base semiconductor foundation, and other semiconductor, optoelectronics, or biotechnology materials, such as silicon-germanium, germanium, gallium arsenide, or indium phosphide. A first conductive layer 106 may be formed on the first dielectric layer 104. For the sake of example only, the first dielectric layer 104 may be formed from silicon oxide and the first conductive layer 106 may be formed from doped polysilicon.

A hard mask layer 108 may be formed on the first conductive layer 106. The hard mask layer 108 may be formed from a dielectric material, such as a nitride. The nitride may include, but is not limited to, silicon nitride ("$Si_3N_4$"). STI region 110 may be formed by patterning the hard mask layer 108 and etching an opening (not shown) through the hard mask layer 108, the first conductive layer 106, and the first dielectric layer 104. The opening may be extended into the semiconductor substrate 102, forming a trench (not shown). Patterning and etching of these layers are performed by conventional techniques. As such, the patterning and etching is not described in detail herein. The trench defines an active region 112 on the semiconductor substrate 102. Silicon oxide may be deposited in the trench and over the hard mask layer 108. The silicon oxide used to fill the trench may ultimately form the STI region 110 between active regions 112. The silicon oxide may be conformally deposited in the trench by a conventional deposition technique, such as by a spin-on process, atomic layer deposition ("ALD"), or an ozone TEOS process. In one embodiment, the silicon oxide may be a spin-on dielectric ("SOD") material. SOD materials are known in the art and are commercially available. The silicon oxide may be a silsesquioxane material ("SSQ") including, but not limited to, hydrogen silsesquioxane ("HSQ"), methyl silsesquioxane ("MSQ"), polyhydrogen silsesquioxane ("pHSQ"), hydrio polysilsesquioxane ("H-PSSQ"), methyl polysilsesquioxane ("M-PSSQ"), and phenyl polysilsesquioxane ("P-PSSQ"). The SOD material may also include carbon, such as the dielectric materials sold under the SILECS® tradename. The SOD material may also include nitrogen, such as a polysilazane. As used herein, the term "polysilazane" refers to an oligomer, cyclic, polycyclic, linear polymer or resinous polymer having multiple Si—N repeating units.

As the silicon oxide is deposited in the trench, seams, voids, gaps, microbubbles, or other cavities may undesirably form in the STI region 110. The seams, voids, gaps, microbubbles, or cavities may introduce empty space into at least one portion of the STI region 110. For convenience, such seams, voids, gaps, microbubbles, or cavities are collectively referred to herein as a "cavity." For the sake of example only, the cavity may form as the silicon oxide is deposited by a conformal deposition technique, such as ALD, a spin-on process, or an ozone TEOS process. FIG. 1A illustrates a cavity 114 in the STI region 110. For the sake of clarity, the size of cavity 114 is exaggerated. While one cavity 114 in one STI region 110 is illustrated in FIG. 1A, each of the STI regions 110 may include none, one, or more than one cavity 114 as long as one of the STI regions 110 includes at least one cavity 114. The presence of cavity 114 may affect uniform etching, device isolation, and overall structural integrity of the STI region 110. In other words, the cavity 114 may prevent substantially uniform etching of the STI regions 110. For instance, if the intermediate semiconductor device structure 100 (shown in FIG. 1A) were etched using a conventional wet etch process, such as HF, the cavity 114 would be etched at a faster, uncontrollable rate than the remainder of the STI region 110. Portions of the silicon oxide may be removed, such as by chemical mechanical polishing ("CMP"), so that an upper surface of the STI region 110 is substantially level with an upper surface of the hard mask layer 108. The intermediate semiconductor device structure 100 having the STI regions 110 with cavity 114 is shown in FIG. 1A.

Figure 1B:
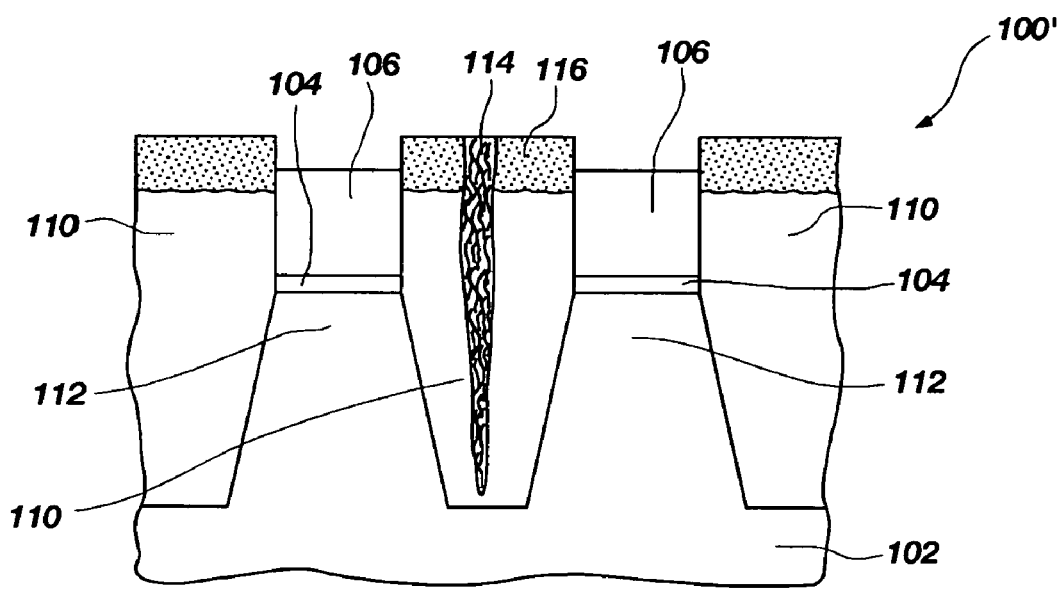

The hard mask layer 108 may be removed by conventional techniques, exposing an upper surface of the first conductive layer 106 of each of the active regions 112, as shown in FIG. 1B. FIG. 1B illustrates intermediate semiconductor device structure 100'. The STI regions 110 of the intermediate semiconductor device structure 100' may be substantially uniformly removed, even though the cavity 114 is present, so that the upper surface of the STI regions 110 lies below the upper surface of the first conductive layer 106. The STI regions 110 may be anisotropically etched without substantially removing other exposed layers, such as first conductive layer 106. The STI regions 110 may be substantially uniformly removed by exposing the silicon oxide to a gaseous mixture of $NH_3$ and HF. The $NH_3$ and HF may react with each other and with the silicon oxide to produce $(NH_4)_2SiF_6$ on a surface of the silicon oxide. The $(NH_4)_2SiF_6$ forms a diffusion barrier 116 on the STI regions 110, as shown in FIG. 1B. As the reaction proceeds, a thickness of the diffusion barrier 116 increases, reducing access of the gaseous $NH_3$ and HF to the surface of the silicon oxide. When $NH_3$ and HF are no longer able to penetrate the diffusion barrier 116, the rate of the reaction slows and, ultimately, stops. As such, the reaction of $NH_3$ and HF with the silicon oxide to produce the $(NH_4)_2SiF_6$ is substantially self-limiting.

To form the diffusion barrier 116, the gaseous mixture of $NH_3$ and HF may be supplied to a first chamber, such as a reaction chamber, in which the intermediate semiconductor device structure 100' is placed. The gaseous mixture may, optionally, include a diluent gas, such as argon, xenon, or helium. To prevent $NH_3$ and HF from prematurely reacting, the NH₃ and HF may be supplied separately to the first chamber. Processing conditions, including but not limited to, temperature, pressure, and flow rates within the first chamber may be controlled: For instance, the temperature of the intermediate semiconductor device structure 100 may be maintained within a range from approximately 10° C. to 30° C., such as at approximately room temperature (approximately 25° C.). The pressure within the first chamber may be maintained within a range of from approximately 6.7×10⁻² PA to approximately 4.0 Pa (from approximately 0.5 mTorr to approximately 30 mTorr). The gaseous mixture may include an equal volume of HF and NH₃ or a greater volume of the HF relative to the NH₃. For instance, a volumetric flow ratio of the HF to the NH₃ in the gaseous mixture may be within a range of from approximately 1/1 to 2/1.

After the reaction is complete, the intermediate semiconductor device structure 100' may be heated in a second chamber to remove the diffusion barrier 116. Alternatively, the diffusion barrier 116 may be removed using a DI water rinse, if exposed material layers on the intermediate semiconductor device structure 100' are not adversely affected by water. The heat may cause the diffusion barrier 116 to thermally decompose into the volatile reaction products (N₂, H₂O, SiF₄, and NH₃), which are exhausted from the second chamber. The intermediate semiconductor device structure 100' may be heated to a temperature within a range of from approximately 80° C. to approximately 200° C., such as from approximately 100° C. to approximately 200° C. or from approximately 125° C. to approximately 150° C. The intermediate semiconductor device structure 100' may be heated for an amount of time within a range of from approximately 60 seconds to approximately 180 seconds. N₂ may be flowed through the second chamber to provide a viscous flow to remove the volatile reaction products. The second chamber may be maintained at a pressure within a range of from approximately 66.6 Pa to approximately 133 Pa (from approximately 500 mTorr to approximately 1 Torr), and the gas flow rate of N₂ may be within a range of from approximately 500 sccm to approximately 3000 sccm.

Figure 1C:
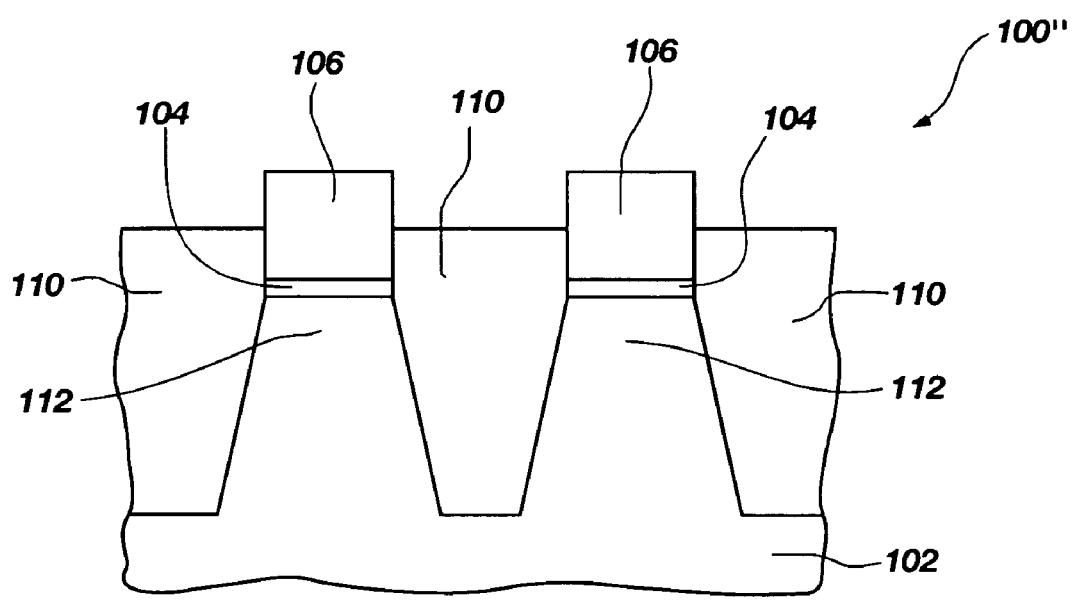

After removing the diffusion barrier 116, the exposed portion of the STI regions 110 may be reacted with additional NH₃ and HF, as previously described, forming another diffusion barrier 116 over the remaining portion of the STI regions 110. The diffusion barrier 116 may be heated, as previously described, to remove the diffusion barrier 116. By exposing the intermediate semiconductor device structure 100 to multiple reaction and heating cycles, a controlled amount of the silicon oxide may be removed from the STI regions 110. However, for the sake of convenience and clarity, only one reaction and heat cycle is illustrated in FIGS. 1A-1C. For the sake of example only, with each reaction and heating cycle, up to approximately 200 Å of the silicon oxide may be removed. By conducting multiple reaction and heat cycles, a desired amount of the STI regions 110 may be removed. FIG. 1C shows intermediate semiconductor device structure 100" after removing the desired amount of the STI regions 110. For instance, up to approximately 600 Å of the STI regions 110 may be removed by performing multiple reaction and heat cycles. By repeating the reaction and heat cycles, larger amounts of silicon oxide may be removed using the gaseous mixture of NH₃ and HF than was previously thought possible. While FIG. 1C shows a portion of the STI regions 110 as being uniformly removed, the reaction and heat cycles may be repeated to remove the desired amount of the STI regions 110, ranging from a portion of the STI regions 110 to substantially all of the STI regions 110.

If the intermediate semiconductor device structure 100 includes exposed layers (not shown) formed from other silicon oxide materials, the intermediate semiconductor device structure 100 may be exposed to the gaseous mixture of NH₃ and HF and heated, as described above, to uniformly remove the STI regions 110 without substantially removing these other silicon oxide materials. For the sake of example only, these other silicon oxide materials may include, but are not limited to, tetraethylorthosilicate ("TEOS"), phosphosilicate glass ("PSG"), or borophosphosilicate glass ("BPSG").

Without being bound by a particular theory, it is believed that the diffusion barrier 116 inhibits diffusion of the gaseous mixture of NH₃ and HF into the cavity 114. As such, the diffusion barrier 116 may enable the STI regions 110 to be substantially uniformly etched even in the presence of the cavity 114. Diffusion length differences of the NH₃ and HF across the cavity 114 relative to other portions of the STI regions 110 may be substantially similar. For instance, the NH₃ and HF may diffuse across the cavity 114 and across other portions of the STI regions 110 at a substantially similar rate when the diffusion barrier 116 is present. Without the diffusion barrier 116, the NH₃ and HF may diffuse across the cavity 114 at a faster rate compared to other portions of the STI regions 110, leading to uncontrolled removal of the STI regions 110 having the cavity 114. It is also believed that the thickness, type, and density of the diffusion barrier 116 formed over the cavity 114 may be different than that formed over the remainder of the STI regions 110. By controlling these parameters of the diffusion barrier 116, such as by adjusting the processing conditions, the STI regions 110 may be uniformly removed. The amount or thickness of the (NH₄)₂SiF₆ forming the diffusion barrier 116 may depend on the ability of the gaseous NH₃ and HF to diffuse to the surface of the silicon oxide, which is controlled by adjusting the processing conditions. The density of the diffusion barrier 116 may also affect the diffusion of the NH₃ and HF. The density of the diffusion barrier 116 is affected by the type and density of the silicon oxide used as the fill material of the STI regions 110. In addition to density, other physical properties of the silicon oxide, such as the strain of the silicon oxide, may affect the density of the diffusion barrier 116.

Figure 1D:
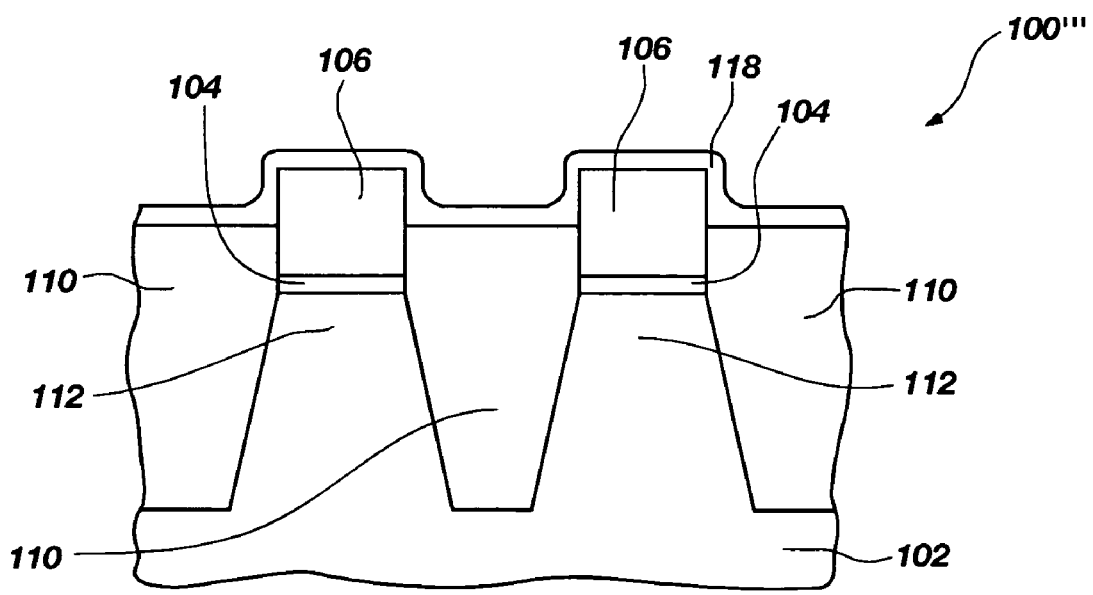
Figure 1E:
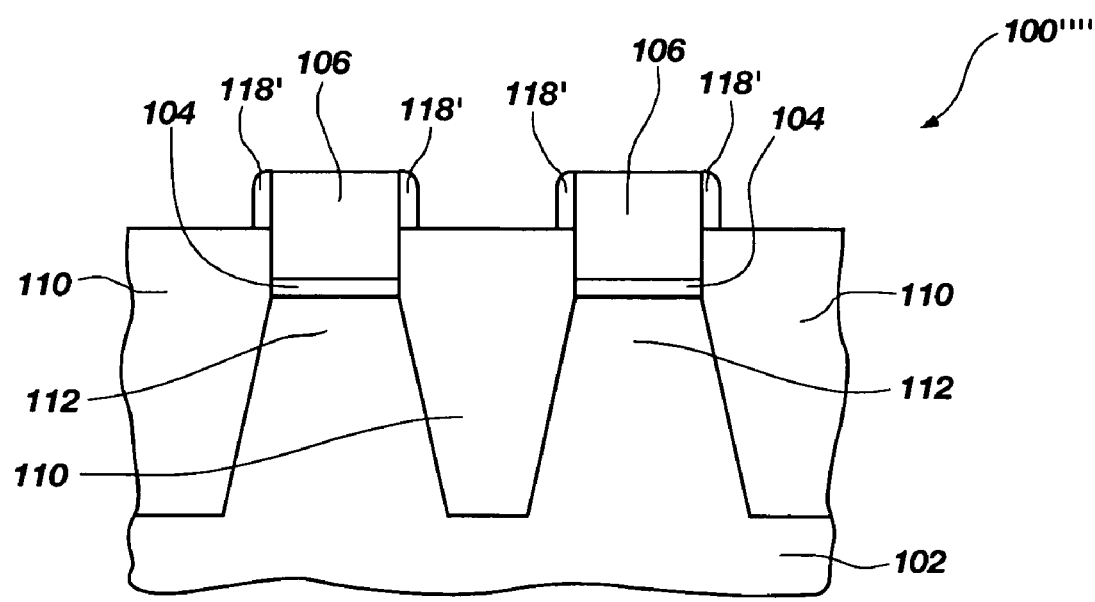
Figure 1F:
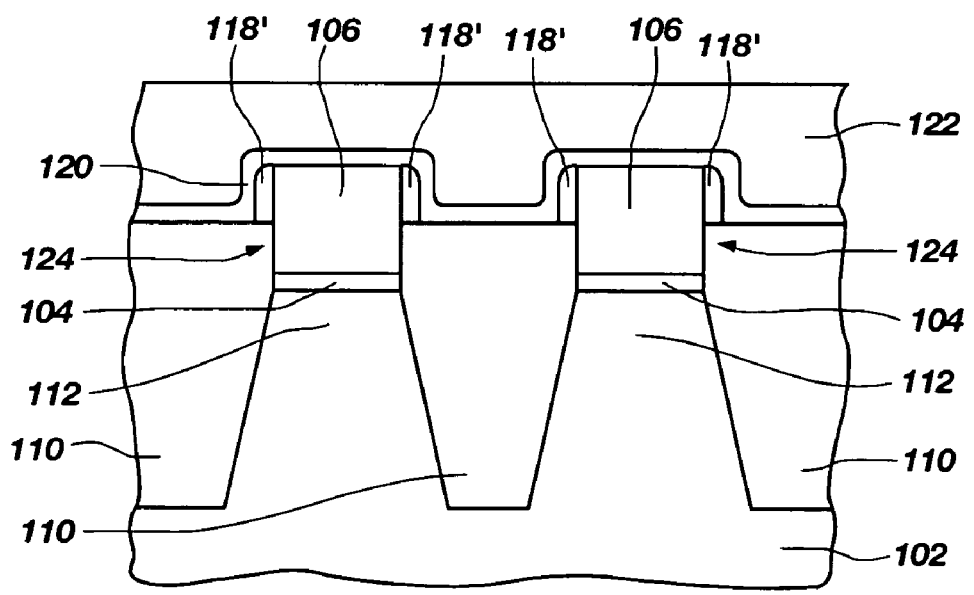

After the desired amount of the STI regions 110 is removed, additional material layers may be formed on the intermediate semiconductor device structure 100", as known in the art, to produce the memory device, such as the NAND FLASH memory device. For the sake of example only, a second conductive layer 118 may be formed overlying the STI regions 110 and the first conductive layer 106, as shown in FIG. 1D. The second conductive layer 118 may be formed from doped polysilicon. Portions of the second conductive layer 118 may be anisotropically etched so that remaining portions of the second conductive layer 118 self align with, and form, conductive spacers 118' on sidewalls of the first conductive layer 106, as shown in FIG. 1E. The conductive spacers 118' increase the surface area of the first conductive layer 106. The first conductive layer 106 with the conductive spacers 118' thereon form floating gates of floating gate memory cells. A second dielectric layer 120 may be formed overlying STI regions 110, the first conductive layer 106, and the conductive spacers 118', as shown in FIG. 1F. The second dielectric layer 120 may be formed from silicon oxide, nitride, oxynitride, oxide-nitride-oxide (ONO), or other dielectric material. A third conductive layer 122, such as a layer of doped polysilicon, may be formed on the second dielectric layer 120. The first dielectric layer 104, the first conductive layer 106, the conductive spacers 118', the second dielectric layer 120, and the third conductive layer 122 form gate stacks 124. Portions of the gate stacks 124 may form a portion of floating gate memory cells, where the first dielectric layer 104 forms a tunnel dielectric layer, the first conductive layer 106 and the second conductive layer 118 form a floating gate, the second dielectric layer 120 is an intergate dielectric layer, and the third dielectric layer 122 forms a control gate (or word line).

Figure 2A:
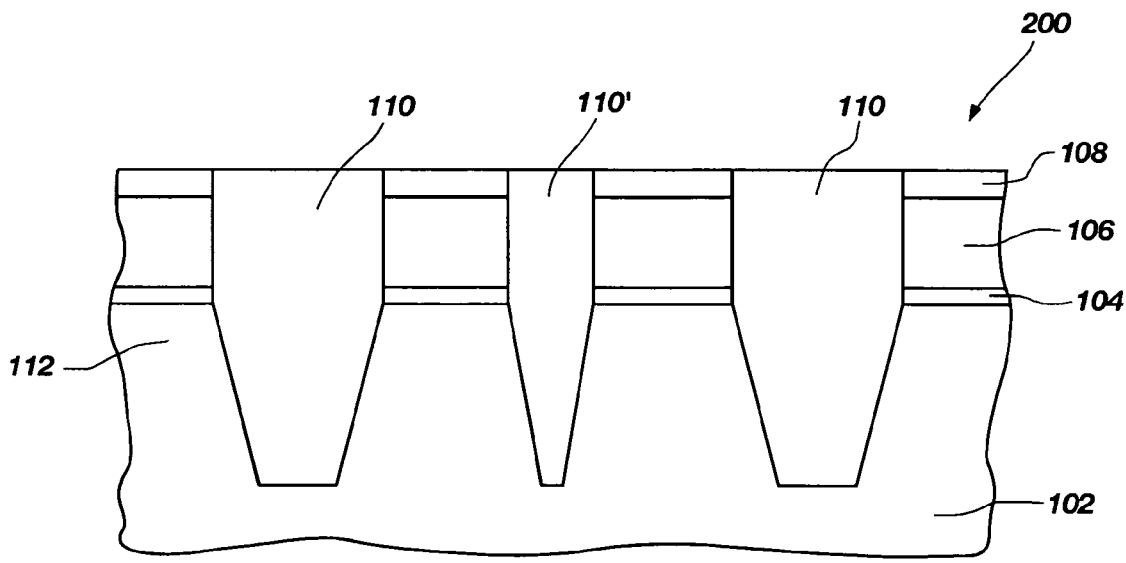
FIGS. 2A-2C are cross-sectional views of a second embodiment of an intermediate semiconductor device structure during various stages of fabrication.
Figure 2B:
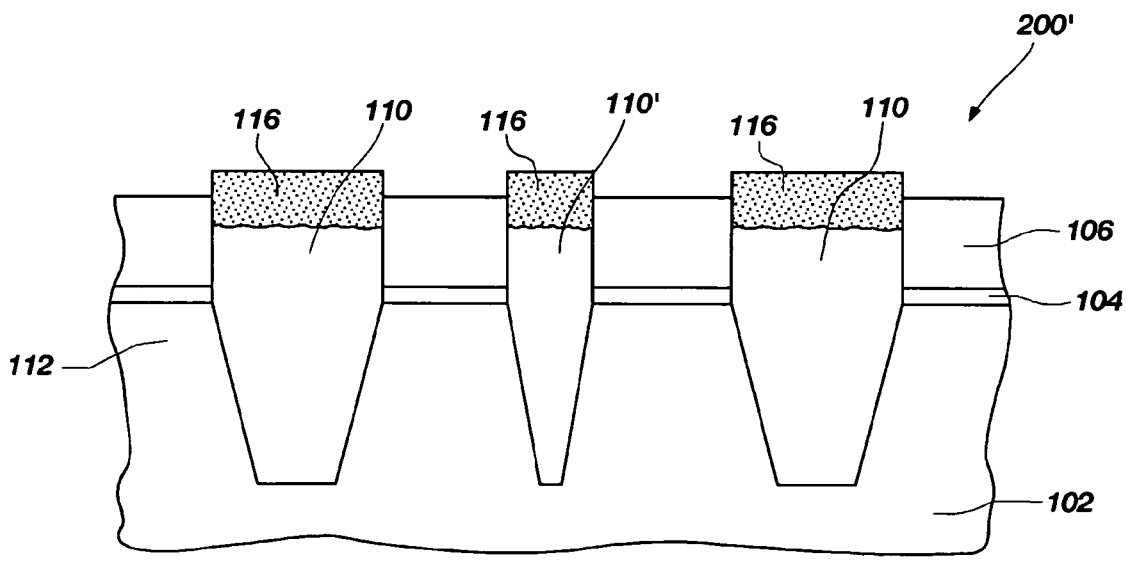
Figure 2C:
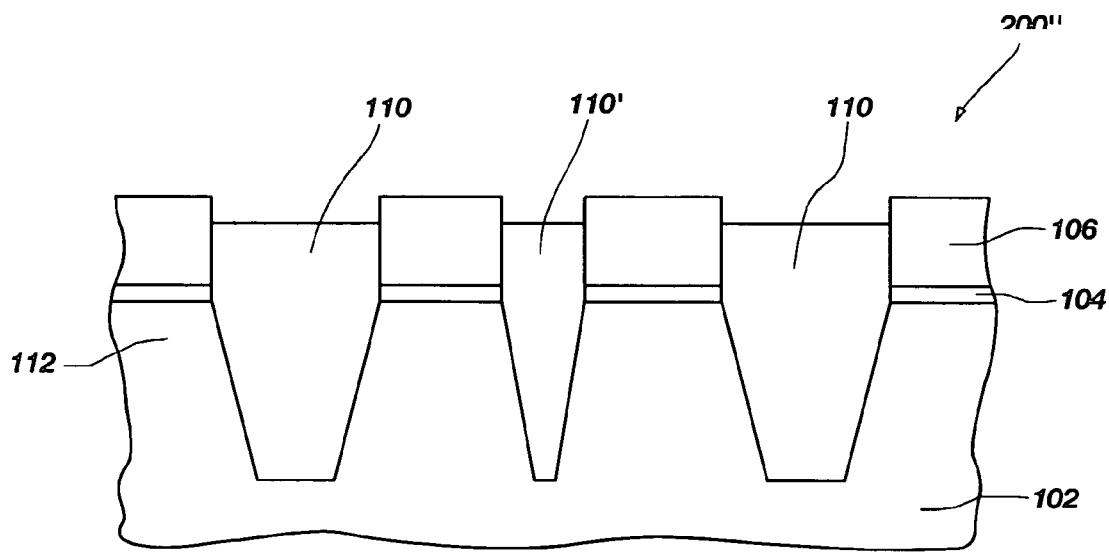

The gaseous mixture of $NH_3$ and HF and heat may also be used to uniformly remove silicon oxide in which portions of the silicon oxide have different physical properties, such as at least one of a different density and a different strain. A first portion of the silicon oxide may have a first physical property, such as a first density or first strain, and a second portion of the silicon oxide may have a second physical property, such as a second density or second strain. For the sake of example only, the first portion of the silicon oxide and the second portion of the silicon oxide may have different densities. For convenience, such a silicon oxide is referred to herein as a "mixed density oxide." The first portion of the silicon oxide may be a low density oxide and the second portion of the silicon oxide may be a high density silicon oxide. For the sake of example only, the mixed density oxide may be present in trenches of different widths, as shown in FIGS. 2A-2C. The silicon oxide may be removed from these trenches without removing other exposed layers, such as first conductive layer 106. As described below, the trenches may be filled with silicon oxide, producing an intermediate semiconductor device structure 200 having STI regions 110, 110' of different widths, as shown in FIG. 2A. The silicon oxide may include at least one portion of a low density oxide and at least one portion of a high density oxide. For the sake of example only, the mixed densities in the silicon oxide may be caused by unequal densification of the STI regions 110, 110' during subsequent processing. The trenches may be formed on the semiconductor substrate 102 as previously described, except that the resulting semiconductor substrate 102 may have multiple trenches with different widths. In other words, a first trench may have a first width and a second trench may have a second, different width. The width differential between the trenches may be such that it would difficult to uniformly remove the silicon oxide using a conventional wet etchant, such as HF. For the sake of example only, the semiconductor substrate 102 may include a first trench having a width of less than or equal to approximately 90 nm, such as a width of approximately 50 nm, and a second trench having a width greater than or equal to approximately 250 nm, such as a width of approximately 500 nm.

The first trench and the second trench may be filled with silicon oxide, such as a SOD material, as previously described, and densified. The densification causes the silicon oxide on a top surface of the semiconductor substrate 102 and the silicon oxide filling the second trench to be substantially densified, while the silicon oxide in the first trench is less densified. As such, the silicon oxide in the first trench may be less dense (more porous) than that in the second trench. Without being bound by a particular theory, the difference in densification is believed to be caused by strain issues. As such, the silicon oxide in the first trench may be low density oxide (STI region 110'), while the silicon oxide in the second trench may be high density oxide (STI region 110). The silicon oxide may be planarized, such as by CMP, removing the silicon oxide from the top surface of the semiconductor substrate 102, while the silicon oxide remains in the first trench and the second trench. In FIGS. 2A-2C, the trenches are shown filled with silicon oxide, producing STI regions 110, 110'.

The intermediate semiconductor device structure 200 shown in FIG. 2A may be exposed to the gaseous mixture of $NH_3$ and HF, forming diffusion barrier 116, as described above. The diffusion barrier is shown in FIG. 2B, which illustrates intermediate semiconductor device structure 200'. Since the silicon oxide in the larger, STI region 110 is substantially densified while the silicon oxide in the narrower, STI region 110' is more porous (less dense), the thickness, type, and density of the diffusion barrier 116 formed over the STI region 110 may differ from that formed over the STI region 110'. The intermediate semiconductor device structure 200' may then be heated, as previously described, to form the volatile reaction products ($N_2$, $H_2O$, $SiF_4$, and $NH_3$). By controlling the parameters of the diffusion barrier 116 formed over the STI regions 110, 110' and the rate at which the volatile reaction products are evaporated, the etch differential between the silicon oxide filling the STI region 110 and the STI region 110' may be reduced. As such, the silicon oxide may be more uniformly removed from STI regions 110, 110', which have different widths. Alternatively, the diffusion barrier 116 may be removed using a DI water rinse, if exposed material layers on the intermediate semiconductor device structure 200' are not adversely affected by water. By conducting multiple reaction and heat cycles, a desired amount of the silicon oxide of the STI regions 110, 110' may be removed, forming intermediate semiconductor device structure 200", as shown in FIG. 2C. After removing the desired amount of the STI regions 110, 110', additional material layers may be formed over the STI regions 110, 110', as previously described and as known in the art, to produce the memory device, such as the NAND FLASH memory device.

If the intermediate semiconductor device structure 200 includes exposed layers (not shown) formed from other silicon oxide materials, the intermediate semiconductor device structure 200 may be exposed to the gaseous mixture of $NH_3$ and HF and heated, as described above, to uniformly remove the STI regions 110, 110' without removing these other silicon oxide materials. For the sake of example only, these other silicon oxide materials may include, but are not limited to, TEOS, PSG, or BPSG.

If the intermediate semiconductor device structure 200 shown in FIG. 2A were exposed to a conventional etchant, such as HF, the STI region 110' would be etched at a faster rate that the STI regions 110.

Figure 3A:
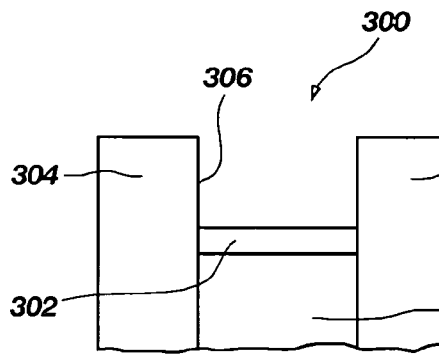
FIGS. 3A-3C are cross-sectional views of a third embodiment of an intermediate semiconductor device structure during various stages of fabrication.
Figure 3B:
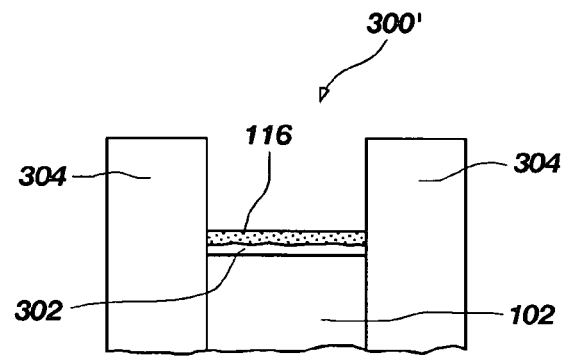
Figure 3C:
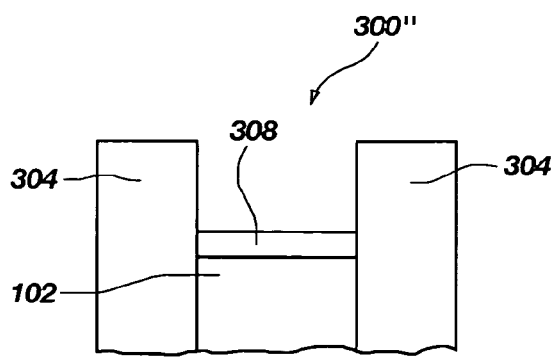

The gaseous mixture of $NH_3$ and HF may also be used to substantially remove a sacrificial oxide without substantially removing an isolation oxide, as shown in FIGS. 3A-3C. FIG. 3A shows intermediate semiconductor device structure 300 in a reverse flow process for fabricating a memory device, such as a NAND FLASH memory device. The intermediate semiconductor device structure 300 may include an exposed sacrificial layer 302, at least one exposed STI region 304, and a semiconductor substrate 102. The sacrificial layer 302 may be formed from silicon oxide, such as a sacrificial oxide. The STI region 304 may be formed from silicon oxide, such as an isolation oxide. The sacrificial layer 302 may be in contact with the STI regions 304. The sacrificial layer 302 may function as a mask to protect the underlying semiconductor substrate 102.

The sacrificial layer 302 may be substantially removed without substantially removing the STI region 304. For instance, the sacrificial layer 302 may be removed without forming divots or "j-hooks" in the STI region 304. In other words, sidewalls 306 of the STI region 304 may remain substantially vertical, with no etching occurring at interfaces of the sacrificial layer 302 with the STI region 304. The sacrificial layer 302 may be exposed to the gaseous mixture of NH₃ and HF, as previously described, forming the diffusion barrier 116 on the sacrificial layer 302. FIG. 3B shows an intermediate semiconductor device structure 300' having the diffusion barrier 116 on the sacrificial layer 302. Without being bound by a particular theory, it is believed that the diffusion barrier 116 prevents or inhibits etching of the sidewalls 306 of the STI region 304. The diffusion barrier 116 may be removed by heating, as previously described. Alternatively, the diffusion barrier 116 may be removed using a DI water rinse, if exposed material layers on the intermediate semiconductor device structure 300' are not adversely affected by water. The gaseous mixture of NH₃ and HF may react with the sacrificial layer 302, forming the reaction products previously described, which are volatilized by applying heat.

Depending on the thickness of the sacrificial layer 302, substantially all of the sacrificial layer 302 may be removed by a single reaction and heat cycle. Alternatively, multiple reaction and heat cycles may be performed. After removing the sacrificial layer 302, a gate oxide layer 308 may be formed over the semiconductor substrate 102 by techniques known in the art, such as by thermally growing the oxide. The intermediate semiconductor device structure 300', shown in FIG. 3C, may be subjected to additional processing, as known in the art, to form an active area over the gate oxide layer 308 on the semiconductor substrate 102.

If the intermediate semiconductor device structure 300 includes exposed layers (not shown) formed from other silicon oxide materials, the intermediate semiconductor device structure 300 may be exposed to the gaseous mixture of NH₃ and HF and heated, as described above, to remove the sacrificial layer 302 without removing these other silicon oxide materials. For the sake of example only, these other silicon oxide materials may include, but are not limited to, TEOS, PSG, or BPSG.

If the intermediate structure 300 (shown in FIG. 3A) was exposed to a conventional etchant, such as HF, the STI region 304 would be etched, in addition to the sacrificial layer 302. For instance, divots or "j-hooks" would be formed in the STI region 304.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of uniformly removing silicon oxide, comprising:
    filling at least one trench in a semiconductor substrate with silicon oxide, the silicon oxide having at least one cavity therein;
    exposing portions of the silicon oxide having the at least one cavity therein to a gaseous mixture; and
    substantially uniformly removing the exposed portions of the silicon oxide having the at least one cavity therein.

2. The method of claim 1, wherein filling at least one trench in a semiconductor substrate with silicon oxide comprises filling at least one trench in a semiconductor substrate comprising at least one isolation region therein, the at least one isolation region comprising silicon oxide having at least one cavity therein.

3. The method of claim 1, wherein substantially uniformly removing the exposed portions of the silicon oxide having the at least one cavity therein comprises substantially uniformly removing up to approximately 200 Å of the silicon oxide.

4. The method of claim 1, wherein substantially uniformly removing the exposed portions of the silicon oxide having the at least one cavity therein comprises substantially uniformly removing substantially all of the silicon oxide.

5. The method of claim 1, wherein substantially uniformly removing the exposed portions of the silicon oxide having the at least one cavity therein comprises anisotropically etching the exposed portions of the silicon oxide having the at least one cavity therein.

6. The method of claim 1, wherein exposing portions of the silicon oxide having the at least one cavity therein to a gaseous mixture comprises exposing the silicon oxide having the at least one cavity therein to a gaseous mixture comprising ammonia and hydrogen fluoride.

7. The method of claim 6, wherein exposing the silicon oxide having the at least one cavity therein to a gaseous mixture comprising ammonia and hydrogen fluoride comprises forming ammonium hexafluorosilicate over the silicon oxide.

8. The method of claim 7, wherein substantially uniformly removing the exposed portions of the silicon oxide having the at least one cavity therein comprises exposing the intermediate semiconductor device structure to heat and thermally decomposing the ammonium hexafluorosilicate.

9. A method of uniformly removing silicon oxide, comprising:
    providing an intermediate semiconductor device structure comprising a semiconductor substrate having a plurality of trenches therein, each of the plurality of trenches filled with silicon oxide and separated from an adjacent trench of the plurality of trenches by a conductive material, wherein the silicon oxide in at least one of the plurality of the trenches has a first property and the silicon oxide in the remaining trenches of the plurality of trenches has a second, different property; and
    substantially uniformly removing the silicon oxide having the first property and the silicon oxide having the second property such that an exposed surface of the silicon oxide having the first property and the silicon oxide having the second property is discontinuous with an exposed surface of the conductive material.

10. The method of claim 9, wherein providing an intermediate semiconductor device structure comprises providing silicon oxide comprising a first portion having a first strain and a second portion having a second strain.

11. The method of claim 9, wherein providing an intermediate semiconductor device structure comprises providing silicon oxide comprising a first portion having a first density and a second portion having a second density.

12. The method of claim 9, wherein providing an intermediate semiconductor device structure comprises providing silicon oxide comprising at least one portion of a low density oxide and at least one portion of a high density oxide.

13. The method of claim 9, wherein providing an intermediate semiconductor device structure comprises providing a semiconductor substrate comprising at least two isolation regions therein, at least one of the at least two isolation regions comprising a low density oxide and at least one of the at least two isolation regions comprising a high density oxide.

14. The method of claim 9, wherein providing an intermediate semiconductor device structure comprises providing a semiconductor substrate comprising at least two trenches filled with the silicon oxide, wherein a first of the at least two trenches comprises a low density oxide and a second of the at least two trenches comprises a high density oxide.

15. The method of claim 9, wherein providing an intermediate semiconductor device structure comprises providing a semiconductor substrate comprising at least two trenches filled with the silicon oxide, wherein a first of the at least two trenches has a width of less than or equal to approximately 90 nm and a second of the at least two trenches has a width of greater than or equal to approximately 250 nm.

16. The method of claim 9, wherein providing an intermediate semiconductor device structure comprises providing a semiconductor substrate comprising at least two trenches filled with the silicon oxide, wherein a first of the at least two trenches has a width of approximately 50 nm and a second of the at least two trenches has a width of approximately 500 nm.

17. The method of claim 9, wherein substantially uniformly removing the silicon oxide having the first property and the silicon oxide having the second property comprises substantially uniformly removing up to approximately 200 Å of the silicon oxide.

18. The method of claim 9, wherein substantially uniformly removing the silicon oxide having the first property and the silicon oxide having the second property comprises exposing the intermediate semiconductor device structure to a gaseous mixture comprising ammonia and hydrogen fluoride and exposing the intermediate semiconductor device structure to heat.

19. The method of claim 18, wherein exposing the intermediate semiconductor device structure to a gaseous mixture comprising ammonia and hydrogen fluoride comprises forming ammonium hexafluorosilicate over the silicon oxide.

20. The method of claim 18, wherein exposing the intermediate semiconductor device structure to heat comprises thermally decomposing the ammonium hexafluorosilicate.

21. A method of removing a sacrificial oxide layer, comprising:
   providing an intermediate semiconductor device structure comprising a semiconductor substrate and an exposed sacrificial layer in contact with exposed isolation regions; and
   substantially removing the exposed sacrificial layer without substantially removing the exposed isolation regions.

22. The method of claim 21, wherein substantially removing the exposed sacrificial oxide layer without substantially removing the exposed isolation regions comprises exposing the intermediate semiconductor device structure to a gaseous mixture comprising ammonia and hydrogen fluoride and exposing the intermediate semiconductor device structure to heat.

23. The method of claim 22, wherein exposing the intermediate semiconductor device structure to a gaseous mixture comprising ammonia and hydrogen fluoride comprises forming ammonium hexafluorosilicate over the exposed sacrificial layer.

24. The method of claim 22, wherein exposing the intermediate semiconductor device structure to heat comprises thermally decomposing the ammonium hexafluorosilicate.

25. A method of uniformly removing silicon oxide, comprising:
   processing an intermediate semiconductor device structure comprising a semiconductor substrate having a plurality of trenches therein, each of the plurality of trenches filled with a silicon oxide material having at least one cavity therein and separated from an adjacent trench by a conductive material; and
   substantially uniformly removing at least a portion of the silicon oxide material having the at least one cavity therein such that an exposed surface of the silicon oxide material is discontinuous with an exposed surface of the conductive material.

26. A method of uniformly removing silicon oxide, comprising:
   processing an intermediate semiconductor device structure comprising an exposed silicon oxide material, the exposed silicon oxide material comprising at least one exposed portion of a first oxide and at least one exposed portion of a second oxide, wherein a presence of the at least one exposed portion of the first oxide and the at least one exposed portion of the second oxide affects substantially uniform removal of the silicon oxide material;
   exposing the intermediate semiconductor device structure to a gaseous mixture comprising ammonia and hydrogen fluoride to form ammonium hexafluorosilicate over the exposed silicon oxide material; and
   exposing the intermediate semiconductor device structure to heat to substantially uniformly remove the at least one exposed portion of the first oxide and the at least one exposed portion of the second oxide.

27. A method of removing a sacrificial oxide layer, comprising:
   processing an intermediate semiconductor device structure resulting in a semiconductor substrate, an exposed sacrificial layer, and exposed isolation regions;
   exposing the intermediate semiconductor device structure to a gaseous mixture comprising ammonia and hydrogen fluoride to form ammonium hexafluorosilicate over the exposed sacrificial layer; and
   exposing the intermediate semiconductor device structure to heat to substantially remove the exposed sacrificial layer without substantially removing the exposed isolation regions.

* * * * *

UNITED STATES PATENT AND TRADEMARK OFFICE
CERTIFICATE OF CORRECTION

| | | |
|---|---|---|
| PATENT NO. | : 7,786,016 B2 | Page 1 of 1 |
| APPLICATION NO. | : 11/652218 | |
| DATED | : August 31, 2010 | |
| INVENTOR(S) | : Nishant Sinha et al. | |

It is certified that error appears in the above-identified patent and that said Letters Patent is hereby corrected as shown below:

In column 11, line 45, in Claim 22, delete "layer" and insert -- material --, therefor.

In column 12, line 3, in Claim 23, delete "layer" and insert -- material --, therefor.

Signed and Sealed this

Thirtieth Day of November, 2010

David J. Kappos
*Director of the United States Patent and Trademark Office*